United States Patent
Ayzenshtat et al.

(10) Patent No.: US 10,121,360 B2
(45) Date of Patent: Nov. 6, 2018

(54) BACKUP AUDIO ROUTING INTEGRATED INTO CARD CAGE WITH SUPERVISORY CIRCUIT

(71) Applicant: Siemens Schweiz AG, Zurich (CH)

(72) Inventors: Leonid Ayzenshtat, Clarks Summit, PA (US); Harald Schermann, Unterschweinbach (DE)

(73) Assignee: Siemens Schweiz AG, Zürich (CH)

( * ) Notice: Subject to any disclaimer, the term of this patent is extended or adjusted under 35 U.S.C. 154(b) by 0 days.

(21) Appl. No.: 15/120,397

(22) PCT Filed: Mar. 10, 2014

(86) PCT No.: PCT/US2014/022339
§ 371 (c)(1),
(2) Date: Aug. 19, 2016

(87) PCT Pub. No.: WO2015/137905
PCT Pub. Date: Sep. 17, 2015

(65) Prior Publication Data
US 2017/0061782 A1 Mar. 2, 2017

(51) Int. Cl.
*G08B 29/10* (2006.01)
*G08B 17/06* (2006.01)
*H03F 1/52* (2006.01)
*H03F 3/183* (2006.01)
*H04R 3/00* (2006.01)
*H04R 29/00* (2006.01)

(52) U.S. Cl.
CPC .............. *G08B 29/10* (2013.01); *G08B 17/06* (2013.01); *H03F 1/526* (2013.01); *H03F 3/183* (2013.01); *H04R 3/007* (2013.01); *H04R 29/007* (2013.01); *H04R 2420/01* (2013.01); *H04R 2420/05* (2013.01)

(58) Field of Classification Search
CPC ......... G08B 29/10; G08B 17/06; H03F 1/526; H03F 3/183; H04R 3/007
See application file for complete search history.

(56) References Cited

U.S. PATENT DOCUMENTS

| 4,086,635 A * | 4/1978 | Saitou .................... G11B 15/12 360/62 |
| 4,622,539 A | 11/1986 | Buss et al. |
| 4,723,292 A | 2/1988 | Taylor |
| 6,370,245 B1 * | 4/2002 | White ................. H04M 1/6033 379/388.03 |
| 2003/0169177 A1 | 9/2003 | Curran et al. |

FOREIGN PATENT DOCUMENTS

| JP | 2005229333 A | 8/2005 |
| KR | 100944182 B1 | 2/2010 |
| KR | 101332797 B1 | 12/2013 |
| WO | 2006050754 A2 | 5/2006 |

OTHER PUBLICATIONS

PCT Search Report dated Jan. 22, 2015, for PCT Application No. PCT/US2014/022339, 14 pages.

* cited by examiner

*Primary Examiner* — Kabir A Timory

(57) ABSTRACT

Methods and systems consistent with the present invention provide an improved system that supervises the operation of a backup amplifier. The method comprises receiving an indication that a primary amplifier failed; determining a configuration of the primary amplifier; and configuring the backup amplifier to match the configuration of the primary amplifier.

7 Claims, 8 Drawing Sheets

BACKUP AUDIO ROUTING INTEGRATED INTO CARD CAGE WITH SUPERVISORY CIRCUIT

RELATED APPLICATION

This patent document claims priority under 35 U.S.C. § 119 and all other benefits from PCT Application No. PCT/US2014/022339, filed Mar. 10, 2014, the content of which is hereby incorporated by reference to the extent permitted by law.

FIELD

The present invention relates generally to methods and systems for integrating backup audio routing and supervisory circuitry into a voice control panel in an alarm system.

BACKGROUND

In alarm systems, such as building fire alarm systems, audio capabilities enable emergency messages to be passed between fire control panels and/or audio panels. Since building alarm systems impact public safety, standards have been developed by organizations in the United States and Europe. For example, some standards require backup amplifiers as part of the audio circuitry in case a primary amplifier fails.

Conventional voice control panels require users to manually wire backup amplifiers to primary amplifiers. In these systems, if the user decides to change the configuration of the amplifiers, the user needs to rewire the connections between the amplifiers. In addition, after the wiring is completed, these systems require the wiring to be tested manually to ensure the system is set up properly.

SUMMARY

Methods and systems consistent with the present invention overcome the limitations of conventional systems by integrating the wiring between primary and backup amplifiers into the card cage of a voice control panel. The integrated wiring reduces the complexity of the installation, reduces problems that may arise from faulty wiring, and results in reduced installation and wiring costs. In addition, the integrated wiring makes the voice control panels more modular because the user may modify the configuration between the primary and backup amplifiers with a flip of a switch.

Methods and systems consistent with the present invention also overcome the shortcomings of conventional systems by providing supervisory circuitry for the backup amplifiers. The supervisory circuitry ensures that the desired configuration is setup and functioning properly without having to perform any manual tests. Thus, the supervisory circuitry adds a redundancy feature that previously did not exist in voice control panels. It provides a much better way to detect and address problems in the voice control panel before the system becomes nonoperational.

In accordance with methods and systems consistent with the present invention, a method is performed by a backup amplifier. The method comprises receiving an indication that a primary amplifier failed; receiving an indication of a configuration for the failed primary amplifier; and configuring the backup amplifier to match the configuration of the failed primary amplifier.

In accordance with articles of manufacture consistent with the present invention, a computer-readable medium is provided. The computer-readable medium contains instructions for controlling a data processing system to perform a method. The method comprises receiving an indication that a primary amplifier failed; receiving an indication of a configuration for the failed primary amplifier; and configuring the backup amplifier to match the configuration of the failed primary amplifier.

In accordance with methods and systems consistent with the present invention, a method is performed by an amplifier for a voice control panel. The method comprises determining whether the amplifier is designated as a backup amplifier; and if it is determined that the amplifier is designated as a backup amplifier, determining whether the configuration of the voice control panel is correct.

In accordance with articles of manufacture consistent with the present invention, a computer-readable medium is provided. The computer-readable medium contains instructions for controlling a data processing system to perform a method. The method comprises determining whether the amplifier is designated as a backup amplifier; and if it is determined that the amplifier is designated as a backup amplifier, determining whether the configuration of the voice control panel is correct.

In accordance with methods and systems consistent with the present invention, a method is performed by a voice control panel. The method comprises determining a configuration of a primary amplifier; receiving an indication that the primary amplifier failed; and notifying a backup amplifier to match the configuration of the primary amplifier.

In accordance with articles of manufacture consistent with the present invention, a computer-readable medium is provided. The computer-readable medium contains instructions for controlling a data processing system to perform a method. The method comprises determining a configuration of a primary amplifier; receiving an indication that the primary amplifier failed; and notifying a backup amplifier to match the configuration of the primary amplifier.

Another embodiment consistent with the present invention is directed to a voice control panel comprising a first amplifier slot having a backup input, a second amplifier slot having a backup output, a third amplifier slot having a backup output, and a switch. The switch is connected to the backup input of the first amplifier slot that toggles between the backup output of the second amplifier slot and the backup output of the third amplifier slot.

An additional embodiment consistent with the present invention is directed to a voice control panel comprising a first amplifier slot having a backup input, a second amplifier slot having a backup input and a backup output, and a switch. The switch is connected to the backup input of the first amplifier slot that toggles between the backup input of the second amplifier slot and the backup output of the second amplifier slot.

Another embodiment consistent with the present invention is directed to a voice control panel comprising a first amplifier slot having a backup input and a second amplifier slot having a backup output, wherein the backup input of the first amplifier slot is connected to the backup output of the second amplifier slot.

A further embodiment consistent with the present invention is directed to a card cage for a voice control panel comprising a primary amplifier having a backup input, a backup amplifier having a backup output, and a connector connecting the backup input of the primary amplifier to the backup output of the backup amplifier.

Other systems, methods, features, and advantages of the present invention will be or will become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The accompanying drawings, which are incorporated in and constitute a part of this specification, illustrate an implementation of the present invention and, together with the description, serve to explain the advantages and principles of the invention. In the drawings.

Figure 1:
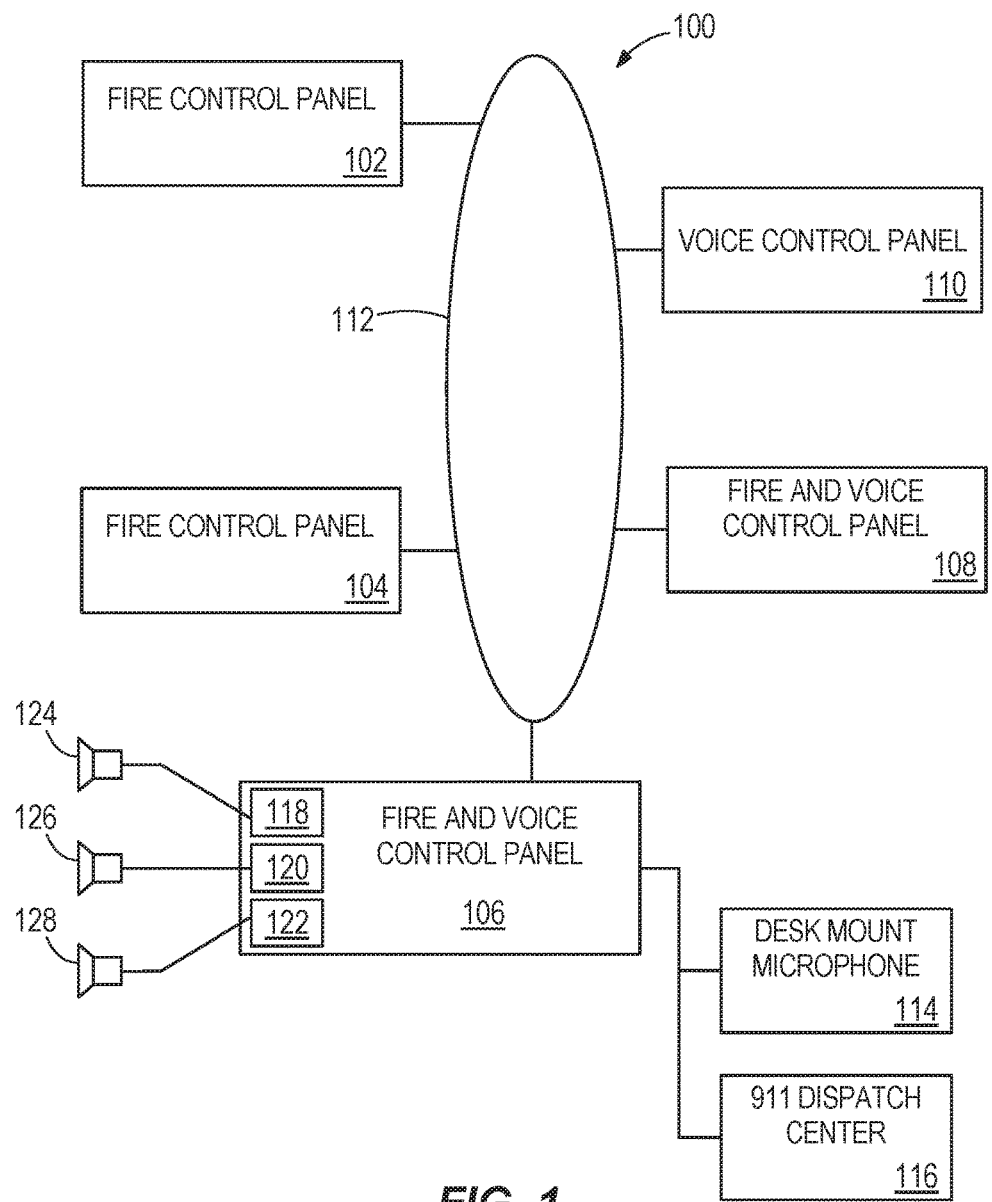
FIG. 1 depicts an exemplary topology diagram for a building fire alarm system.

Reference will now be made in detail to the description of the invention as illustrated in the drawings. While the invention will be described in connection with these drawings, there is no intent to limit it to the embodiment(s) disclosed. On the contrary, the intent is to cover all alternatives, modifications, and equivalents included within the spirit and scope of the invention as defined by the appended claims.

DETAILED DESCRIPTION OF THE INVENTION

FIG. 1 depicts an exemplary topology diagram 100 for a building fire and audio alarm system approach. The building fire and audio alarm system may have numerous fire control panels 102 and 104, fire and voice control panels 106 and 108, and voice control panels 110. In other implementations there may be more or fewer devices in the system. In yet other implementations, additional panels such as security panels or HVAC control panels may be present. The panels 102-110 may be networked together by a data network 112. The data network may have a physical layer of wire, radio waves, fiber optic cables, coaxial cable, or a combination of any of the above. Over the physical layer, additional protocol layers may be implemented to carry data, such TCP/IP network (commonly called the internet). The data network 112 may be configured as a local area network (LAN) that connects only the panels and building automation systems.

The fire and voice control panels, such as fire and voice control panel 106, may have associated desk mounted microphones 114 and connections to emergency centers, such as a 911 dispatch center 116. In other implementations, the desk microphone may be an internal microphone or other audio input device. Additionally, the voice control panels and the fire and voice control panels include voice amplifier cards (VAC) 118-122 with audio outputs for connection to speakers 124-128, as depicted for fire and voice control panel 106.

Figure 2:
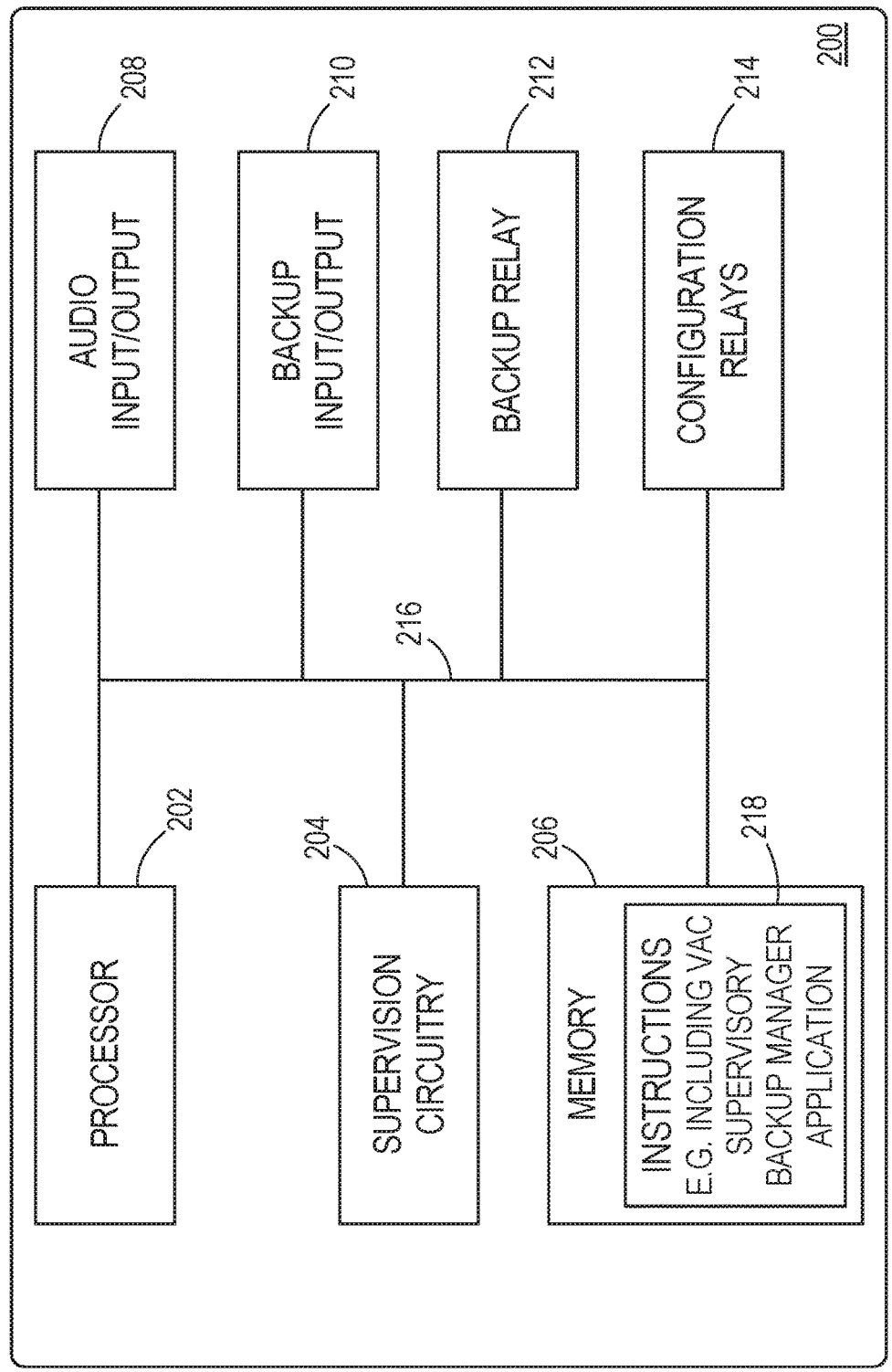
FIG. 2 depicts a data processing system for a voice amplifier card (VAC) suitable for implementing methods and systems consistent with the present invention.

FIG. 2 depicts an exemplary data processing system 200 for the VAC suitable for practicing methods and systems consistent with the present invention. Data processing system 200 includes a processor 202, supervisory circuitry 204, memory 206, audio input/output 208, backup input/output 210, a backup relay 212, and configuration relays 214. These internal components exchange information with one another via a system bus 216. The supervisory circuitry 204 can be implemented with hardware, software firmware or any combination thereof. Although data processing system 200 contains a single processor, it will be apparent to those skilled in the art that methods consistent with the present invention operate equally as well with a multi-processor environment. More or less components can be used. For example, known data processing system components for VACs can be used, e.g., fire safety panel components.

Configuration relays 214 control the configuration of the amplifier. In particular, configuration relays 214 identify whether the amplifier has a class A configuration or a class B configuration, as is well known to one having ordinary skill in the art. The backup relay 212 connects VAC to its backup amplifier when VAC fails. The backup input 210 for each VAC includes an on-board termination resistor (not shown).

Memory 206 includes instructions 218 that may be executed to cause the data processing system 200 to perform any one or more of the methods or functions disclosed herein. The instructions 218 include a VAC supervisory backup manager application. The VAC supervisory backup manager application can be used to perform the logic described in FIGS. 5A-5C. The data processing system 200 may operate as a standalone device or may be connected, e.g., using a network, to other computer systems or peripheral devices.

Figure 3:
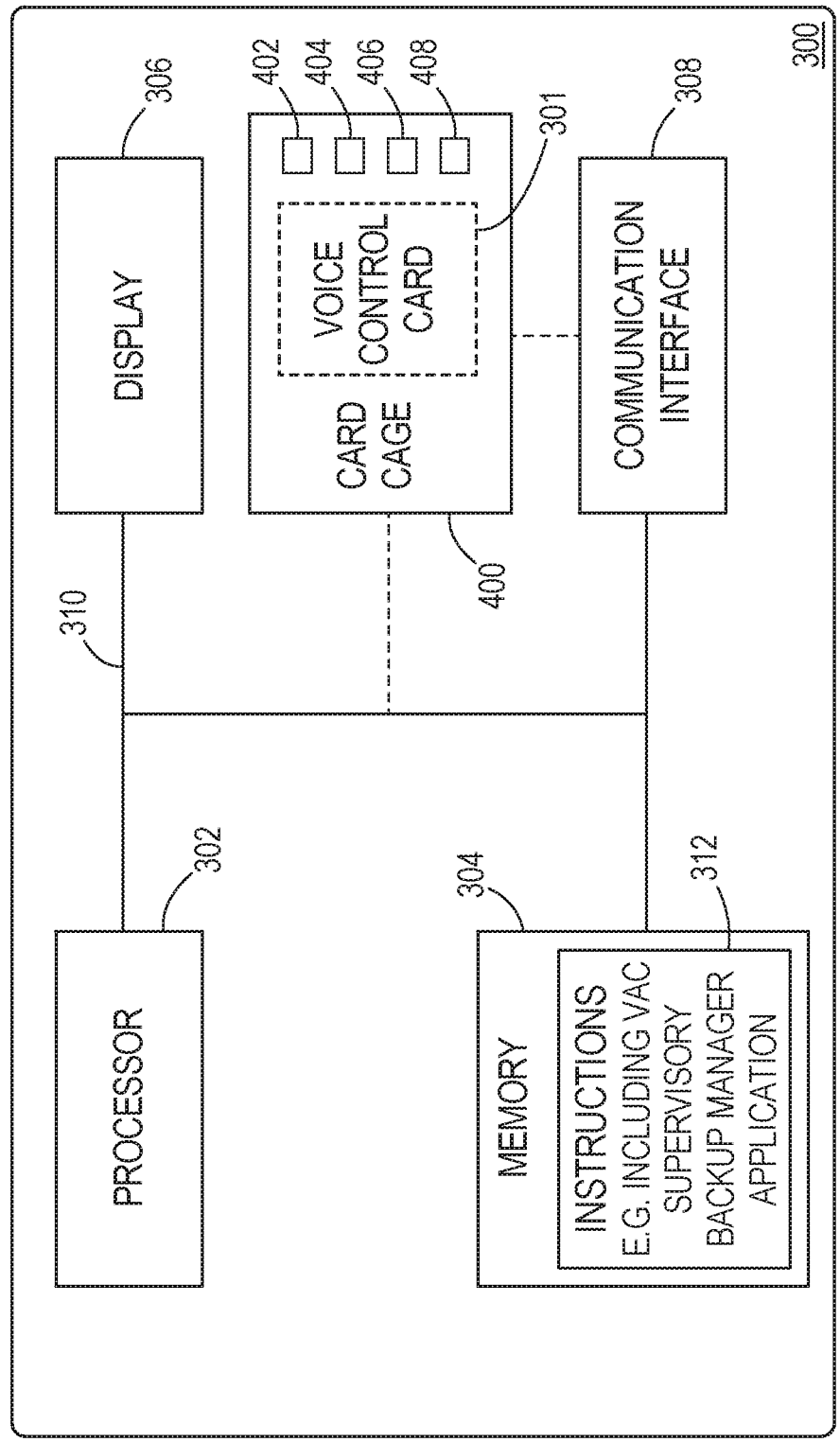
FIG. 3 depicts a data processing system for a voice control panel for implementing methods and systems consistent with the present invention.

FIG. 3 depicts an exemplary data processing system 300 for the voice control panel, e.g., panels 106, 108, 110 of FIG. 1, suitable for practicing methods and systems consistent with the present invention. Data processing system 300 may include a processor 302, memory 304, display 306, communication interface 308, and a card cage 400. The card cage 400 includes card cage slots 402, 404, 406 and 408 adapted to receive VACs. In one embodiment, shown in FIG. 3, the processor 302, memory 304 including instructions 312 and communication interface 308 are incorporated into a mother board of the data processing system 300 (e.g., panels 106, 108, 110). In an alternative embodiment, the card cage 400 is adapted to include a slot for receiving a voice control card 301 (shown in phantom view in FIG. 3) that incorporates the processor 302, memory 304 including instructions 312 and communication interface 308. In this embodiment, the voice control card 301 would be in signal and/or data communication with the display 306 of the data processing system 300 or respective panel 106, 108 and 110. In either embodiment, the processor 302 is operatively configured to be in signal and/or data communication with the VACs inserted in the card cage slots 402, 404, 406 and 408 as described in further detail herein. More or less components and more or less card cage slots can be used. These components can exchange information with one another via a system bus 310. The card cage 400 can connect with the system bus 310 directly and/or through the communication interface 308. Communication interface 308 allows data processing system 300 to communicate with components of the system (e.g., VACs) and to the user, e.g., through a commissioning tool (described below). Although data processing system 300 contains a single processor, it will be apparent to those skilled in the art that methods consistent with the present invention operate equally as well with a multi-processor environment.

Memory 304 includes instructions 312 that may be executed to cause the data processing system 300 to perform any one or more of the methods or functions disclosed herein. The instructions 312 can include a VAC supervisory manager application. The VAC supervisory manager application can perform the logic described in FIG. 6. The data processing system 300 may operate as a standalone device or may be connected, e.g., using a network, to other computer systems or peripheral devices.

Figure 4:
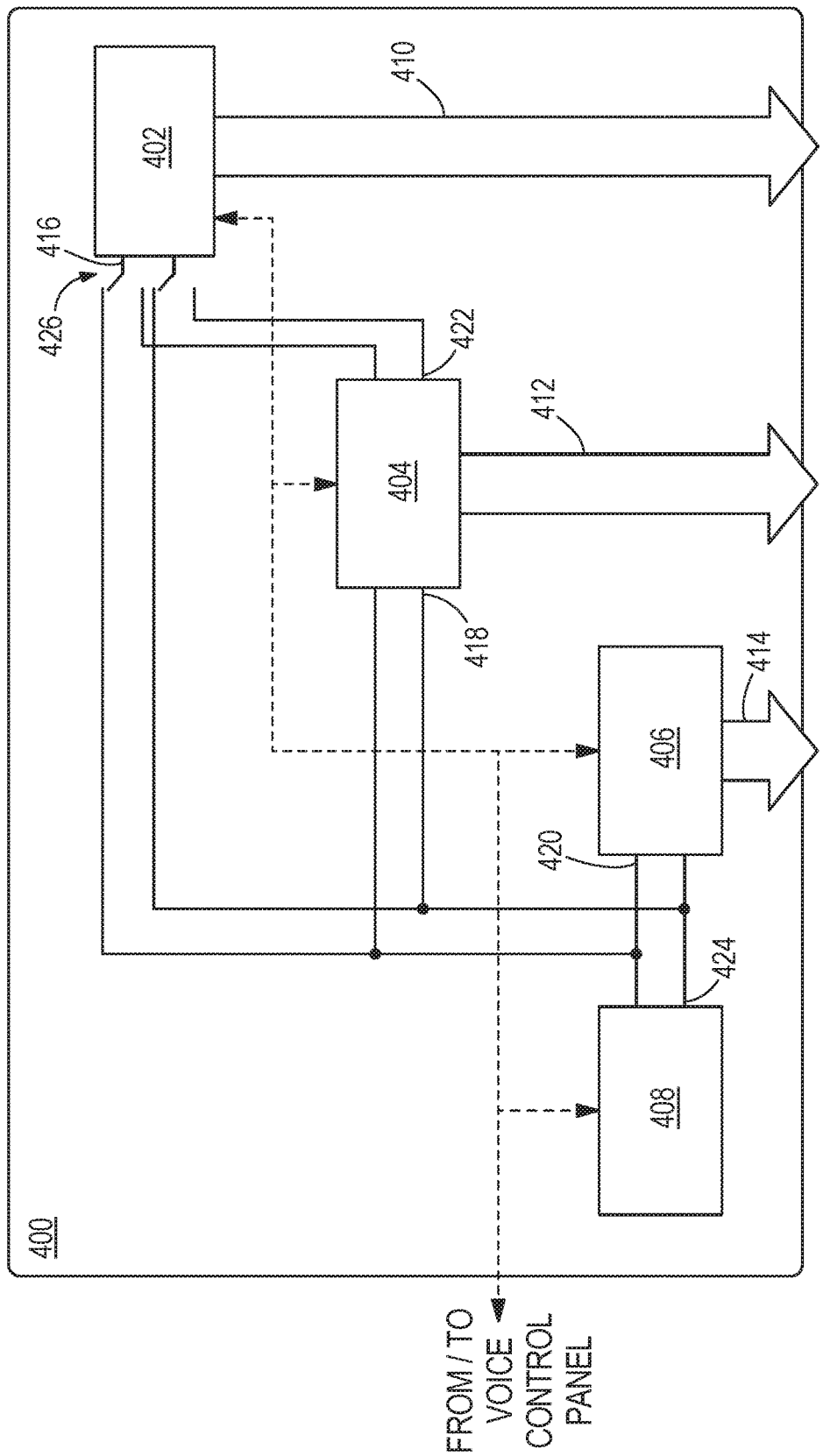
FIG. 4 depicts a block diagram of exemplary circuitry between voice amplifier card slots in the cards cage of the voice control panel consistent with the present invention.

FIG. 4 depicts a block diagram of exemplary circuitry between VAC slots in the card cage 400 of a voice control panel (e.g., 106-110 FIG. 1) consistent with the present invention. In one example, card cage 400 includes four slots 402-408 adapted to contain the VACs. One having skill in the art will appreciate that methods and systems consistent with the present invention may include a different number of slots in the card cage 400. The audio outputs 410, 412, 414 of slots 402-406 may be connected to speakers (e.g., consistent with speakers 124, 126, 128 in FIG. 1). The backup output 424 of slot 408 is connected to the backup inputs 418, 420 of slots 404, 406. Switch 426 switches the backup input 416 of slot 402 between the backup output 424 of slot 408 and the backup output 422 of slot 404. Switch 426 may be any type of switching mechanism that can handle the voltage and current of the amplifier output. The slots 402-408 for VACs preferably are identical, except for addressing circuitry (e.g., hardwired identification pull-down resistors), which will allow the supervisory circuitry 204 of VAC to identify which slot the VAC is plugged into.

For purposes of explanation, FIG. 4 depicts two different backup configurations. Other types of configurations are possible. In the first configuration, when backup input 416 of slot 402 is connected to the backup output 424 of slot 408, the VAC plugged into slot 408 is the backup amplifier for the primary amplifiers plugged into slots 402, 404, 406. In the second configuration, when backup input 416 of slot 402 is connected to the backup output 422 of slot 404, the VAC plugged into slot 408 is the backup amplifier for the primary amplifier plugged into slot 406, and the VAC plugged into slot 404 is the backup amplifier for the primary amplifier plugged into slot 402.

Although card cage 400 includes four amplifier slots 402-408, a user need not plug amplifiers into all amplifier slots. For example, if the system is configured to have one backup amplifier to three primary amplifiers (the "3-1 configuration") and if only one primary amplifier is needed, the user may plug the primary amplifier into any of slots 402-406. Similarly, if the system is configured to have two primary amplifiers, with each of those backed up by an individual backup amplifier (the "1-1 configuration") and only one primary amplifier is needed, the user may decide whether to use slots 406 and 408 for the primary and backup amplifiers, or slots 402 and 404 for the primary and backup amplifiers.

Using a commissioning tool, the user notifies VAC supervisory manager application 312 of the voice control panel how the card cage 400 is to be configured. For example, the user notifies VAC supervisory manager application 312 of the voice control panel whether the card cage 400 is in the 3-1 configuration or the 1-1 configuration, and the total number of primary and backup amplifiers that are included in the system. The VAC supervisory manager application 312 of the voice control panel, in turn, provides this information to the supervisory circuitry 204 of each VAC plugged into one of the card cage slots 402-408. The supervisory circuitry 204 of VAC may thus determine whether the VAC functions as a primary amplifier or a backup amplifier depending on whether the card cage 400 is in the 3-1 configuration or in the 1-1 configuration.

Figure 5A:
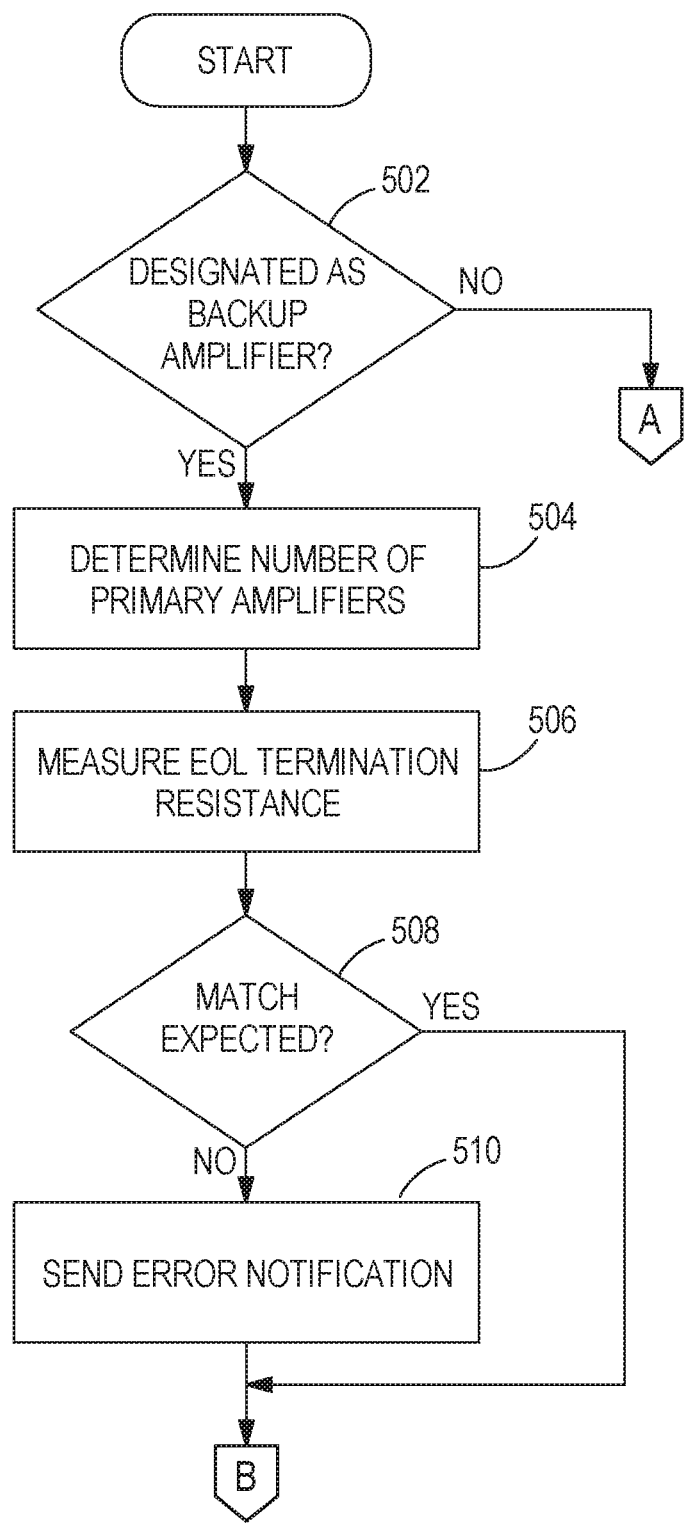
FIGS. 5A-C depict a flow diagram illustrating steps performed by the data processing system depicted in FIG. 2, in accordance with methods and systems consistent with the present invention.
Figure 5B:
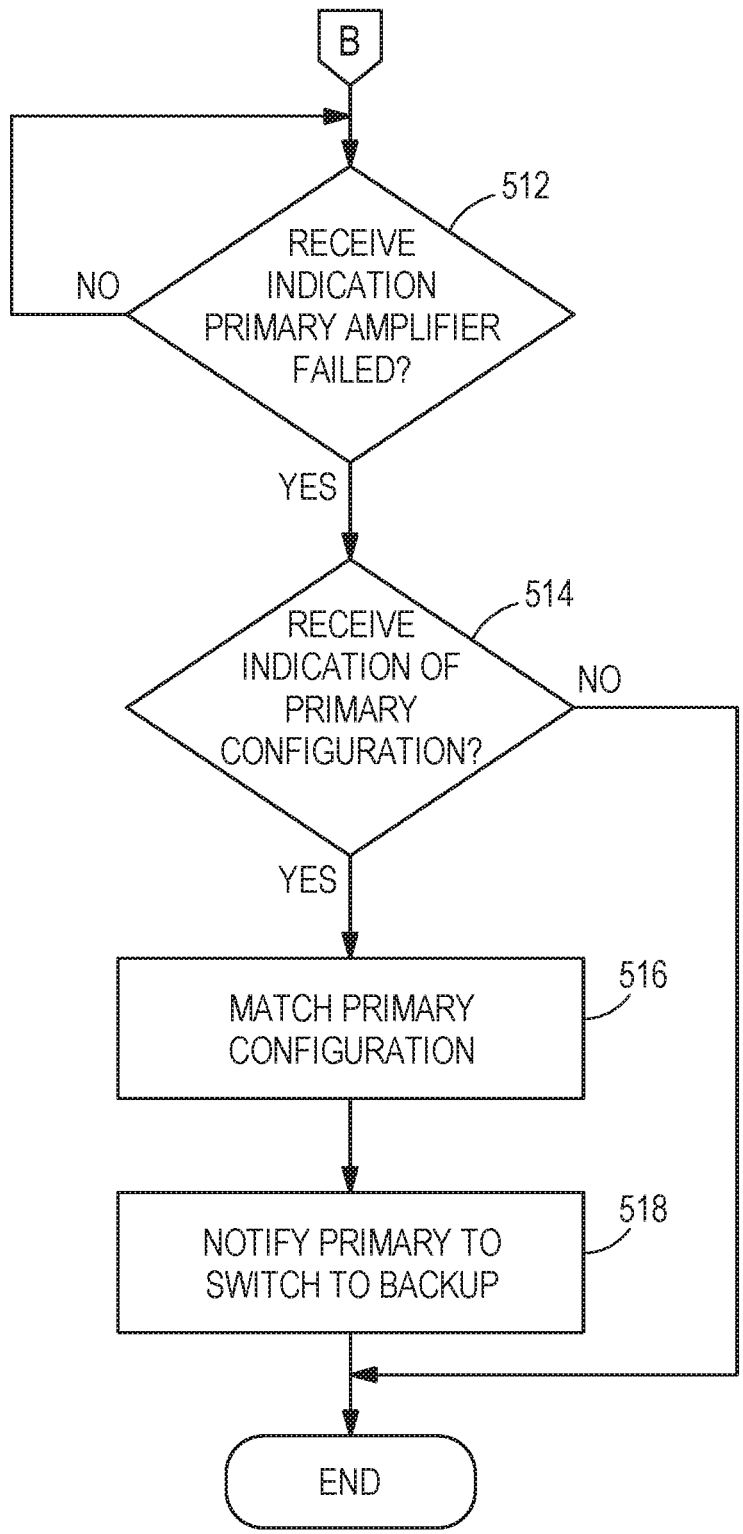
Figure 5C:
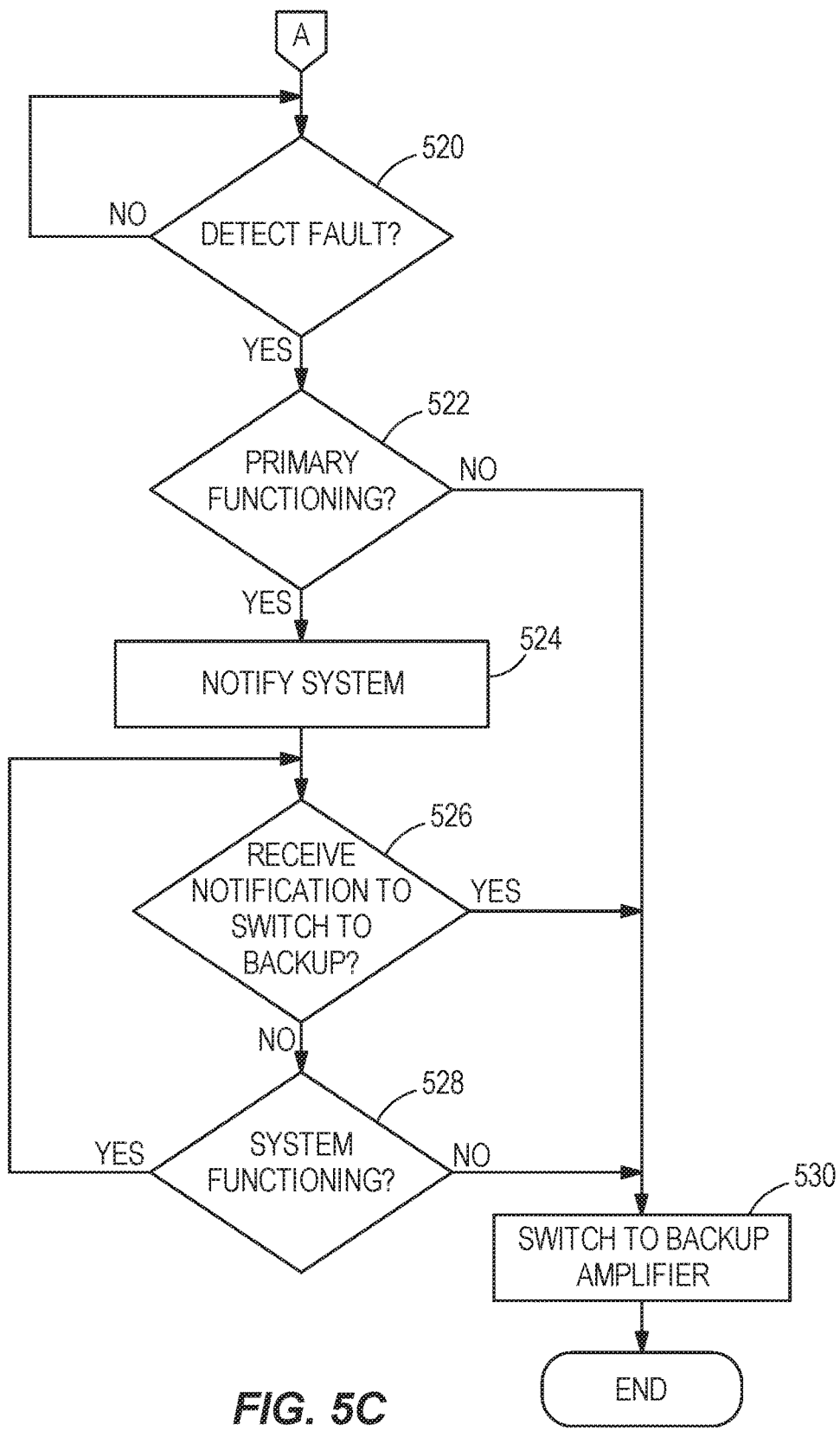

The flow chart of FIGS. 5A-C provides additional details regarding the operation of the VAC (e.g., the supervisory circuitry 204 in combination with the VAC supervisory backup manager application 218 of the VAC) consistent with an implementation of the present invention. Whether a VAC is being used as a primary amplifier or a backup amplifier can be determined when the VACs are placed into the slots 402-408 of the card cage 400. Since the VAC knows whether the card cage 400 is in the 3-1 configuration or the 1-1 configuration, the VAC initially determines whether it is designated as a backup amplifier based on what slot it is plugged into (502). If the VAC determines that it is designated as a backup amplifier, it determines the number of primary amplifiers it is designated to backup (504). VAC also measures the end of line ("EOL") termination resistance (506). As discussed above, each amplifier's backup input includes an on-board termination resistor. Thus, the supervisory circuitry 204 of the backup amplifiers can detect several levels of EOL termination resistance by putting minor DC current through the output circuit.

VAC then determines if the EOL termination resistance is as expected (508). If VAC determines that the EOL termination resistance is not what it expects (i.e., if the system detects an error in the expected circuit connections), it sends an error notification to the VAC supervisory manager application 312 of the voice control panel (510). For example, if the backup amplifier sees no EOL resistor, then either it or the primary amplifier has a connection fault. In another example, if the backup amplifier in slot 408 sees one-third of the expected termination resistance, then switch 426 is in the wrong position. This could also be verified by the state of backup VAC in slot 404, which should see an open in the same situation because it should not be connected to anything in the 1-1 configuration. The VAC supervisory manager application 312 of the voice control panel may notify the user regarding any detected error by displaying an appropriate message on the voice control panel display.

After sending the error notification or if the EOL termination resistance is as expected, VAC waits until it receives an indication of a primary amplifier failure (512, FIG. 5B). After receiving an indication of a primary amplifier failure, VAC determines if it received an indication of whether the failed amplifier is a class A or a class B amplifier (514). If VAC did receive an indication of the failed amplifier class, VAC then adjusts its configuration relays 214 to match the configuration of the failed amplifier (516), and notifies the failed amplifier through the VAC supervisory manager application 312 of the voice control panel to switch to VAC as the backup amplifier (518).

If at 502, VAC determines that it is not designated as a backup amplifier (i.e., it determines that it is a primary amplifier), it waits until it detects a fault (520, FIG. 5C) and confirms that it is still functioning properly (522). If VAC determines that it is functioning properly, it notifies the system regarding the fault (524). If VAC does not receive a notification from the VAC supervisory manager application 312 to switch to the backup amplifier (526), it determines whether the system is functioning (528). If it determines that the system is functioning, it waits until it receives a notification from the system to switch to backup amplifier (526) and switches its backup relay to connect to its backup amplifier (530). If it determines at 522 or 528 that either it or the system is not functioning, it switches its backup relay to connect to its backup amplifier (530).

In conventional systems, the backup amplifiers were required to have the same configuration as the primary amplifiers. With the implementation of supervisory circuitry 204 in the present invention, the configuration of the backup amplifiers no longer needs to be set during installation. Instead, the backup amplifiers may adjust their configuration relays 214 to match the configuration of the primary amplifier after the primary amplifier fails, as discussed with respect to FIGS. 5A-C above.

Figure 6:
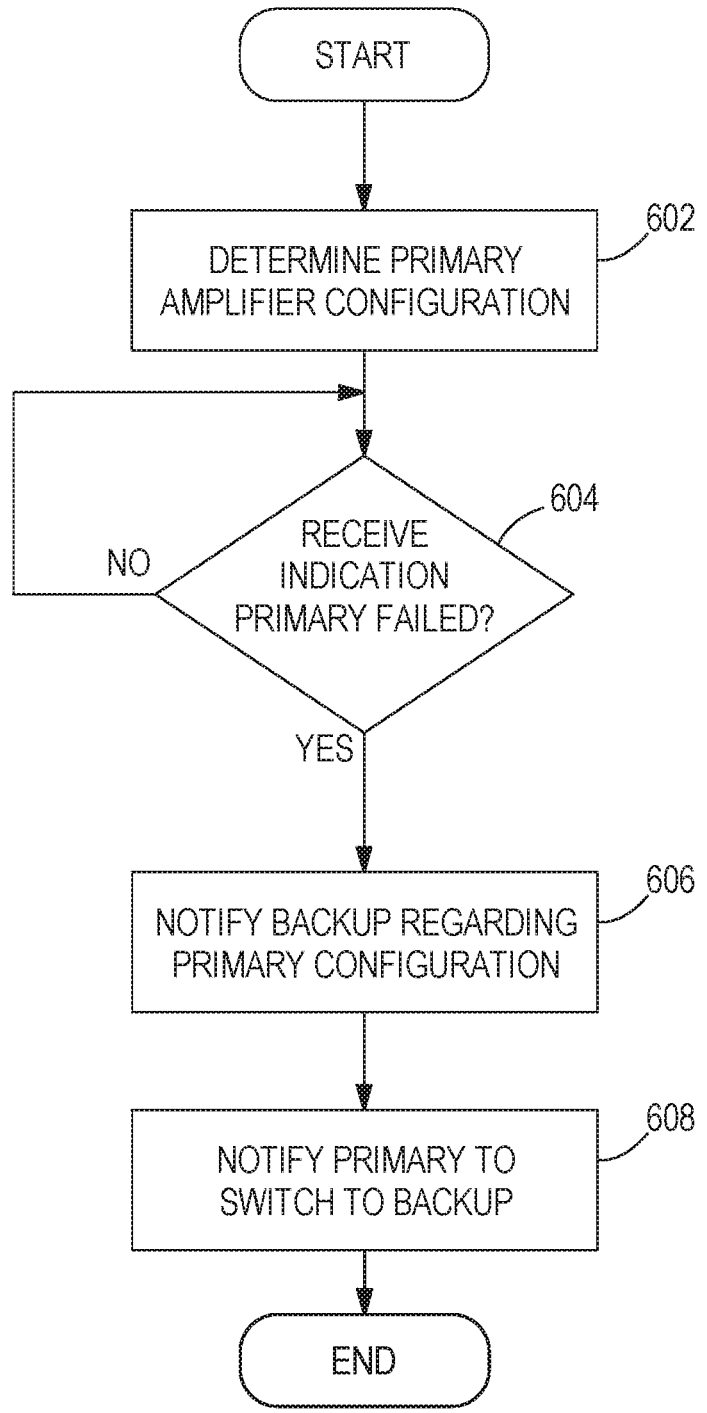
FIG. 6 depicts a flow diagram illustrating steps performed by the data processing system depicted in FIG. 3, in accordance with methods and systems consistent with the present invention.

The flow chart of FIG. 6 provides additional details regarding the operation of the voice control panel consistent with the implementation of supervisory circuitry 204 of respective VACs. When the user is configuring the card cage 400, the VAC supervisory manager 312 identifies whether each primary amplifier has a class A or class B configuration. Thus, the VAC supervisory manager application 312 of voice control panel may determine the configuration for each primary amplifier (602). After the VAC supervisory manager application 312 of voice control panel receives an indication that one of the primary amplifiers failed (604), it notifies the backup amplifier regarding the configuration of the failed primary amplifier (606) and notifies the failed primary amplifier switch to its backup amplifier (608).

While various embodiments of the present invention have been described, it will be apparent to those of skill in the art that many more embodiments and implementations are possible that are within the scope of this invention. Accordingly, the present invention is not to be restricted except in light of the attached claims and their equivalents.

What is claimed is:

1. A voice control panel comprising:
   a first amplifier slot having a backup input;
   a second amplifier slot having a backup output;
   a third amplifier slot having a backup output; and
   a switch connected to the backup input of the first amplifier slot that switches between the backup output of the second amplifier slot and the backup output of the third amplifier slot so that the backup input of the first amplifier slot is either connected to the backup output of the second amplifier slot or to the backup output of the third amplifier slot.

2. The voice control panel of claim 1, further comprising a fourth amplifier slot having a backup input, wherein the backup output of the third amplifier slot is connected to the backup input of the fourth amplifier slot.

3. The voice control panel of claim 1, the second amplifier slot further including a backup input the switch configured to toggle between the backup input of the second amplifier slot and the backup output of the second amplifier slot.

4. The voice control panel of claim 3, wherein the backup output of the third amplifier slot is connected to the backup input of the second amplifier slot.

5. The voice control panel of claim 1, further comprising a fourth amplifier slot having a backup input, wherein the backup output of the third amplifier slot is connected to the backup input of the fourth amplifier slot.

6. The voice control panel of claim 1, wherein the backup input of the first amplifier slot is connected to the backup output of the second amplifier slot.

7. The voice control panel of claim 1, wherein the backup input of the third amplifier slot is connected to the backup output of the second amplifier slot.

* * * * *